(12) United States Patent  
Yao et al.

(10) Patent No.: US 11,744,058 B2  
(45) Date of Patent: Aug. 29, 2023

(54) SYSTEMS AND METHODS FOR MANUFACTURING ELECTRONIC DEVICE HOUSINGS

(71) Applicant: Microsoft Technology Licensing, LLC, Redmond, WA (US)

(72) Inventors: Zhicong Yao, Seattle, WA (US); Han Li, Sammamish, WA (US); Scott Douglas Bowers, Woodinville, WA (US); Massood Nikkhah, Kent, WA (US); Joseph Benjamin Gault, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 391 days.

(21) Appl. No.: 16/856,989

(22) Filed: Apr. 23, 2020

(65) Prior Publication Data

US 2021/0161038 A1 May 27, 2021

Related U.S. Application Data

(60) Provisional application No. 62/939,329, filed on Nov. 22, 2019.

(51) Int. Cl.
*H05K 9/00* (2006.01)
*H05K 5/00* (2006.01)
*B29C 45/00* (2006.01)
*B32B 5/20* (2006.01)
*B29K 55/02* (2006.01)

(52) U.S. Cl.
CPC ....... *H05K 9/0081* (2013.01); *B29C 45/0001* (2013.01); *B32B 5/20* (2013.01); *H05K 5/0017* (2013.01); *H05K 9/002* (2013.01); *H05K 9/0084* (2013.01); *B29K 2055/02* (2013.01)

(58) Field of Classification Search
CPC .... H05K 9/0081; H05K 5/0017; H05K 9/002; H05K 9/0084; B29C 45/0001; B32B 5/20; B29K 2055/02
See application file for complete search history.

(56) References Cited

U.S. PATENT DOCUMENTS

| | | |
|---|---|---|
| 3,749,021 A | 7/1973 | Burgess |
| 8,129,034 B2 | 3/2012 | Palumbo et al. |
| 9,005,420 B2 | 4/2015 | Tomantschger et al. |

(Continued)

FOREIGN PATENT DOCUMENTS

| | | |
|---|---|---|
| CN | 106535513 A | 3/2017 |
| CN | 206077463 U | 4/2017 |

(Continued)

OTHER PUBLICATIONS

WO 2016/127427 English translation (Year: 2016).*
"International Search Report and Written Opinion Issued in PCT Application No. PCT/US20/057589", dated Feb. 16, 2021, 12 Pages.

*Primary Examiner* — Larry W Thrower
(74) *Attorney, Agent, or Firm* — RAY QUINNEY & NEBEKER P.C.; Paul N. Taylor

(57) ABSTRACT

A method of manufacturing an electronic device housing includes obtaining a monolithic body of RF transparent material and plating a surface of the monolithic body with a nanograin coating to increase the structural rigidity of the monolithic body. A portion of the nanograin coating is thereafter removed to create an RF window.

14 Claims, 5 Drawing Sheets

(56) References Cited

U.S. PATENT DOCUMENTS

| | | | |
|---|---|---|---|
| 9,975,311 | B2 | 5/2018 | Hamajima et al. |
| 9,999,148 | B2 | 6/2018 | Lee |
| 10,483,620 | B2 | 11/2019 | Rappoport et al. |
| 2002/0090506 | A1 | 7/2002 | Protzner et al. |
| 2009/0066588 | A1* | 3/2009 | Cheng ............... H01Q 1/2266 343/702 |
| 2010/0315299 | A1* | 12/2010 | Bibi ............... H04R 1/1033 29/601 |

FOREIGN PATENT DOCUMENTS

| | | |
|---|---|---|
| CN | 108381851 A | 8/2018 |
| EP | 2663907 A2 | 11/2013 |
| KR | 101425589 B1 | 8/2014 |
| WO | 2016127427 A1 | 8/2016 |

\* cited by examiner

SYSTEMS AND METHODS FOR MANUFACTURING ELECTRONIC DEVICE HOUSINGS

CROSS-REFERENCE TO RELATED APPLICATIONS

This application claims priority to and the benefit of U.S. Provisional Patent Application Ser. No. 62/939,329, filed Nov. 22, 2019, which is hereby incorporated by reference in its entirety.

BACKGROUND

High stiffness materials, such as metal and plastics reinforced with high glass fiber and/or carbon fiber load, are used to make conventional housings for consumer electronics. However, these materials are either conductive or have undesirable dielectric properties and/or poor radio frequency (RF) transparency. To achieve the desired RF performance, plastics with low dielectric constants and low dissipation factors are used to mold antenna windows. These plastics are conventionally either neat resins or with low fiber contents, which results in low stiffness of these components. These plastics do not have enough strength, modulus, and other mechanical properties to be used to mold the main enclosures for consumer electronics. The high stiffness metal or plastic main enclosures and low stiffness but RF transparent antenna windows are joined by nano-molding, insert molding, or gluing, which are complex and expensive joining processes and yield lower mechanical and cosmetic qualities.

BRIEF SUMMARY

In some embodiments, an electronic device contains a radio frequency (RF) wireless communication device. The RF communication device transmits and receives RF signals through a portion of the electronic device housing. RF transparent materials lack the structural rigidity to support and protect the electronic components of the electronic device. Cutting or molding an aperture into the housing to allow RF signals in and out of the housing is structurally and aesthetically undesirable.

In some embodiments, a method of manufacturing an electronic device housing includes obtaining a monolithic body of RF transparent material and plating a surface of the monolithic body with a nanograin coating to increase the structural rigidity of the monolithic body. A portion of the nanograin coating is thereafter removed to create an RF window.

In some embodiments, an electronic device includes a monolithic body of RF transparent material and a nanograin coating position on an outer surface of the monolithic body. The monolithic body at least partially defines an internal volume of the electronic device, and a RF wireless communication device is positioned in the internal volume. An RF window of the monolithic body is positioned adjacent to the communication device. The RF window is a portion of the monolithic body in which the nanograin coating is not present on the outer surface of the RF transparent material.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 6-1 is a top view of laser etching a nanograin coating on an electronic device housing, according to at least one embodiment of the present disclosure;

FIG. 6-2 is a bottom view of uncoated connection points of the electronic device housing of FIG. 6-1, according to at least one embodiment of the present disclosure;

FIG. 6-3 is a perspective view of a plurality of monolithic bodies with electrically conductive coating material thereon, according to at least one embodiment of the present disclosure;

DETAILED DESCRIPTION

The present disclosure relates generally to devices, systems, and methods for manufacturing an electronic device with a radio frequency (RF) transparent window in the housing of the electronic device. More particularly, the present disclosure relates to systems and methods of manufacturing an electronic device housing with an RF window without cutting, ablating, or otherwise penetrating through the structural body panel of the housing.

In some embodiments, an electronic device has a housing comprises one or more body panels. Each of the body panels partially defines an internal volume of the electronic device, and, when the body panels are assembled, the internal volume may contain the electronic components of the electronic device. In some embodiments, the electronic components are able to be damaged from exposure to electromagnetic (EM) fields and/or the operation of the electronic components is adversely affected by exposure to EM fields. In some embodiments, the body panels provide EM shielding to the electronic components. In other embodiments, the body panels include RF transparent material and a coating is applied to a surface of the RF transparent material to provide EM shielding to the electronic components.

In some embodiments, a communication device of the electronic device is configured to communicate wirelessly with other communication devices via RF signals broadcast and received by the communication device through a portion of the electronic device housing. The communication device is positioned inside the internal volume and the RF signals broadcast and received by the communication device pass through an RF window in the housing. In some embodiments, the RF window in the housing is a portion of a body panel in which the RF transparent material is continuous to provide structural support and strength to the electronic device while the coating is absent from the RF window adjacent the communication device to allow RF signals to pass through the body panel.

Figure 1:
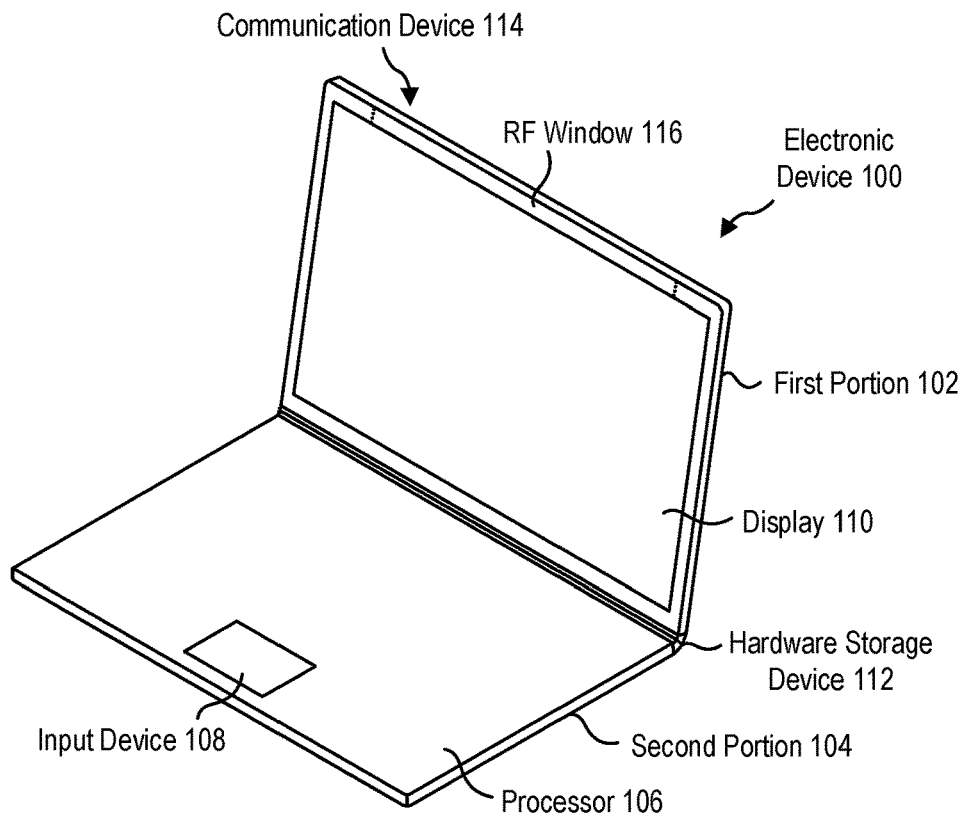
FIG. 1 is a perspective view of an electronic device, according to at least one embodiment of the present disclosure.

FIG. 1 is a perspective view of an embodiment of a computing device according to the present disclosure. In some embodiments, the computing device 100 has a plurality of hardware components with which the thermal module communicates. In some embodiments, the computing device 100 is a laptop device as illustrated in FIG. 1. In some embodiments, the computing device is a tablet computing device, a hybrid computing device, a desktop computing device, a server computing device, a wearable computing device (e.g., a smartwatch, a head-mounted device, or other wearable device), a smart appliance (e.g., a smart television, a digital personal assistant or hub, an audio system, a home entertainment system, a home automation system, an in-car infotainment system), or other computer device.

In some embodiments, the computing device 100 has a first portion 102 and second portion 104 that are movably connected to one another. The computing device 100 includes various components located in or one the portions of the computing device 100 that are in data communication through one or more buses and interfaces. In some embodiments, the thermal module establishes and uses two-way communication with one or more of the components. Examples of components include a processor(s) 106, input device(s) 108, display(s) 110, hardware storage device(s) 112, communication device(s) 114, and other components.

In some embodiments, the processor(s) 106 is a central processing unit (CPU) that performs general computing tasks for the computing device 100. In some embodiments, the processor(s) 106 is or is part of a system on chip (SoC) that is dedicated to controlling or communicating with one or more subsystems of the computing device 100.

In some embodiments, the display(s) 108 is a liquid crystal display (LCD), a light emitting diode (LED) display, a thin film transistor (TFT) display, a cathode ray tube (CRT) display, or other display. In some embodiments, the display 108 is integrated into the computing device 100, such as illustrated in the embodiment of FIG. 1. In some embodiments, the display 108 is a discrete monitor or other display that is in wired or wireless data communication with the computing device 100.

In some embodiments, the input device(s) 110 is a mouse, a stylus, a trackpad, a touch-sensitive device, a touch-sensitive display, a keyboard, or other input human-interface device. In some embodiments, the input device(s) 108 is part of the computing device 100, such as a trackpad or a keyboard. In some embodiments, the input device(s) 110 is a discrete device in data communication with the computing device 100, such as a stylus in wireless data communication with the computing device 100.

In some embodiments, the hardware storage device(s) 112 is a non-transient storage device including any of RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

The processor 106, the hardware storage device 112, the control hardware for the input device 108 and/or the display 110, and other electronic components of the electronic device 100 may be adversely affected by exposure to EM fields. In some embodiments, the structural panels of the first portion 102 and/or the second portion 104 have a EM shielding coating positioned thereon that provides EM shielding to the components positioned inside the internal volumes of the first portion 102 and/or the second portion 104.

In some embodiments, the communication device(s) 114 is in data communication with the processor(s) 106 to allow communication with one or more external computing devices, networks, or components. In some embodiments, the communication device is a network communications device, such as a wireless (e.g., WiFi) antenna. In some embodiments, the communication device is a short-range wireless communication, such as a BLUETOOTH connection or a WiFi-Direct connection, that allows data communication between the computing device 100 and electronic devices in proximity to the computing device 100. In some embodiments, the communication device is a near-field communications (NFC) device that is used for data communication, wireless charging of other components and/or accessory devices, or both. In some embodiments, an RF window 116 in the first portion 102 and/or second portion 104 allows the communication device 114 to broadcast and receive RF signals through the housing of the electronic device 100.

Figure 2:
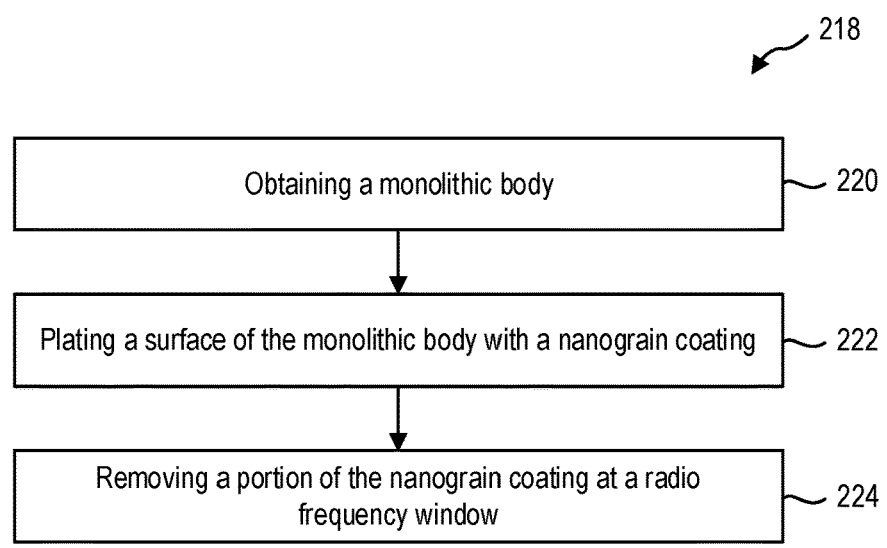
FIG. 2 is a flowchart illustrating a method of manufacturing an electronic device housing, according to at least one embodiment of the present disclosure.

Referring now to FIG. 2, in some embodiments, a method 218 of manufacturing an electronic device includes obtaining (220) a monolithic body. In some embodiments, the monolithic body is a body panel of an electronic device housing. In some embodiments, the monolithic body is the entire electronic device housing. In some embodiments, the monolithic body is a continuous piece of RF transparent material. The RF transparent material is continuous throughout the monolithic body. In some embodiments, the monolithic body has at least one aperture through the monolithic body from a first surface to an opposing second surface. In some embodiments, the monolithic body is a first body panel of an electronic device housing and has at least one structural post thereon to allow connection to a second body panel of the electronic device housing.

In some embodiments, obtaining the monolithic body includes injection molding the monolithic body. The RF transparent material may be a polymer that is plastic at an elevated temperature and conducive to injection molding. In some embodiments, obtaining the monolithic body includes machining the monolithic body from a billet or other precursor of the RF transparent material. In some embodiments, obtaining the monolithic body includes forming, stamping, or forging the monolithic body from a sheet or panel of the RF transparent material. In at least some embodiments, obtaining the monolithic body includes injection molding an RF transparent material to a near-finished state and subsequently machining a portion of the RF transparent material from the near-finished state to produce the monolithic body.

In some embodiments, the RF transparent material is a thermoplastic polymer. In some embodiments, the RF transparent material is acrylonitrile butadiene styrene (ABS). In some embodiments, the ABS is a fiber-loaded ABS. In some embodiments, the RF transparent material is not directly electroplatable but can be metallized by electroless plating or other chemical seeding methods, so that the substrate becomes electroplatable.

The method further includes plating (222) a surface of the monolithic body with a conductive coating. In some embodiments, the conductive coating is a nanograin coating in which the average grain size of the coating material is less than 1 micrometer, less than 100 nanometers (nm), or less than 10 nm. In some embodiments, the conductive coating is a metallic coating including grain of a metal or metal alloy. In some embodiments, the conductive coating includes cobalt, nickel, or combinations thereof.

In some embodiments, a nanograin coating provides a smoother outer surface with less surface relief and/or texture than a coating with a larger grain size and equivalent thickness. In some embodiments, a nanograin coating provides an outer surface with equivalent surface relief and/or texture to a coating with a larger grain size with a lesser coating thickness. In some embodiments, a nanograin coating exhibits a more random grain orientation in thin coatings than a coating with a larger grain size. A more random grain orientation allows for a more isotropic material property to the coating and the nanograin coating may exhibit less warpage than a coating with a larger grain size.

In some embodiments, a nanograin coating exhibits improved durability and stability relative to a traditional plating of similar or the same materials. In some embodiments, a nanograin coating exhibits improved thermal stability, improved solar radiation stability, lower porosity, improved tensile strength, lower thermal expansion, and other improved bulk material properties relative to a coating with larger grain size.

Nickel coatings can trigger an allergic reaction in some individuals. In some embodiments, a nanograin coating according to the present disclosure includes cobalt. A cobalt nanograin coating maintains the mechanical properties disclosed herein while avoiding nickel allergic reactions in users.

In some embodiments, it is aesthetically and/or functionally desirable to have the monolithic body be continuous through an RF window. For example, the region of the monolithic body that is adjacent to a communication device may be structurally important to the rigidity of the electronic device housing. In other examples, the region of the monolithic body that is adjacent to a communication device may be a visually prevalent portion of the electronic device, such as the bezel of display cover, a surface near an input device, or other area that is conspicuous while using the device and would be distracting to a user to have an obvious gap, seam, or other discontinuity in the electronic device housing.

To allow a communication device to transmit and receive RF signals through the RF window, the coating is removed (224) from the RF window while maintaining the integrity of the monolithic body and the RF transparent material of the monolithic body underneath the coating. In some embodiments, the coating is removed by ablation or mechanical removal of the coating from the monolithic body. For example, the coating may be ablated by a laser, ion beam, or other stream of energize particles. In at least one example, the coating is removed by laser etching the coating from the monolithic body. In some examples, the coating is mechanically removed through friction or erosion of the coating. For example, the coating may be removed by an abrasive wheel or belt such as sandpaper, or the coating may be removed by a flow of abrasive material such as sandblasting.

In some embodiments, a masking material is applied to the RF window region of the monolithic body prior to the application of the coating. After the coating is applied to the surface of the monolithic body and to the masking material, the masking material is removed from the surface of the monolithic body. Removal of the masking material therefore removes the overlaid portion of the coating applied to the masking material. In some embodiments, a combination of removal method is used. In at least one embodiment, the coating at a perimeter edge of the masking material is etched or ablated to produce a precise discontinuity (e.g., a border) around the masking material, and the masking material is subsequently lifted from the surface of the monolithic body. The initial etching or ablation of the coating allows the masking material and coating on the masking material to be removed without unintentionally removing adjacent coating outside of the RF window region. In some cases, masking can be done with a metal fixture. The fixture can be plated for conductivity purpose. In some embodiments, the metal mask or masks function as auxiliary electrodes or electrical shield, which reduce or shield electrical field and prevent metallic ion deposition or plating on the RF window region. After plating, the fixture can be removed to leave the RF window region un-plated.

Figure 3:
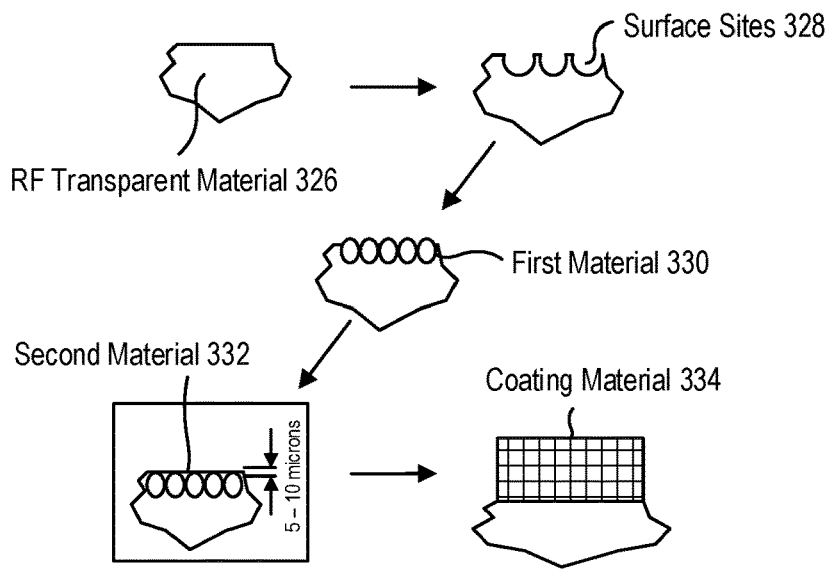
FIG. 3 is a schematic illustration of a plating process, according to at least one embodiment of the present disclosure.

In some embodiments, application of the coating includes shaping the RF transparent material into a near finished shape of the monolithic body. For example, FIG. 3 illustrates an embodiment of a plating method of RF transparent material 326. The surface of the monolithic body is then chemically etched to provide surface texture and/or sites 328 into which a first material 330 can be applied. In some embodiments, the first material 330 is a metal. In at least one example, the first metal 330 is cobalt or a cobalt alloy. The first material 330 is applied in an electroless application that allows the first material 330 to bond to the RF transparent material 326. In some embodiments, the RF transparent material 326 is a polymer that is nonconductive and incompatible with electro-deposition. In some embodiments, the RF transparent material 326 is a polymer that is nonconductive, but the polymer is plateable. For example, ABS has double bonds of polybutadiene that allow for electroplating.

In some embodiments, the method of plating further includes using electro-deposition to deposit a second material 332 on the first material 330. For example, the second material 332 may be a second metal that is electro-deposited onto the first metal. In some embodiments, the second material 332 has a thickness of approximately 5-10 micrometers (μm). In some embodiments, the second material 332 has a thickness of more than 10 μm or less than 5 μm. The second material 332 provides a substantially flat and continuous surface upon which the nano-grain coating material 334 is subsequently applied.

In some embodiments, the nano-grain coating 334 has a thickness in a range having an upper value, a lower value, or upper and lower values including any of 2 µm, 5 µm, 10 µm, 20 µm, 30 µm, 40 µm, 50 µm, 60 µm, 70 µm, 80 µm, 90 µm, 100 µm, or any values therebetween. In some examples, the nano-grain coating 334 has a thickness greater than 2 µm. In some examples, the nano-grain coating 334 has a thickness less than 100 µm. In some examples, the nano-grain coating 334 has a thickness between 2 µm and 100 µm.

In some embodiments, the nanograin coating material 334 has an average grain size of less than 50 nanometers (nm). In some embodiments, the nanograin coating material 334 has an average grain size of less than 25 nm. In some embodiments, the nanograin coating material 334 has an average grain size of less than 15 nm. In some embodiments, the nanograin coating material 334 has an average grain size of less than 10 nm. In some embodiments, the nanograin coating material 334 has an average grain size of less than 5 nm.

In some embodiments, the nanograin coating is applied by physical vapor deposition (PVD). In some embodiments, the nanograin coating is applied by chemical vapor deposition (CVD). In some embodiments, the nanograin coating is applied by plasma enhanced deposition. In some embodiments, the nanograin coating is applied by electroplating in a fluid.

Figure 4:
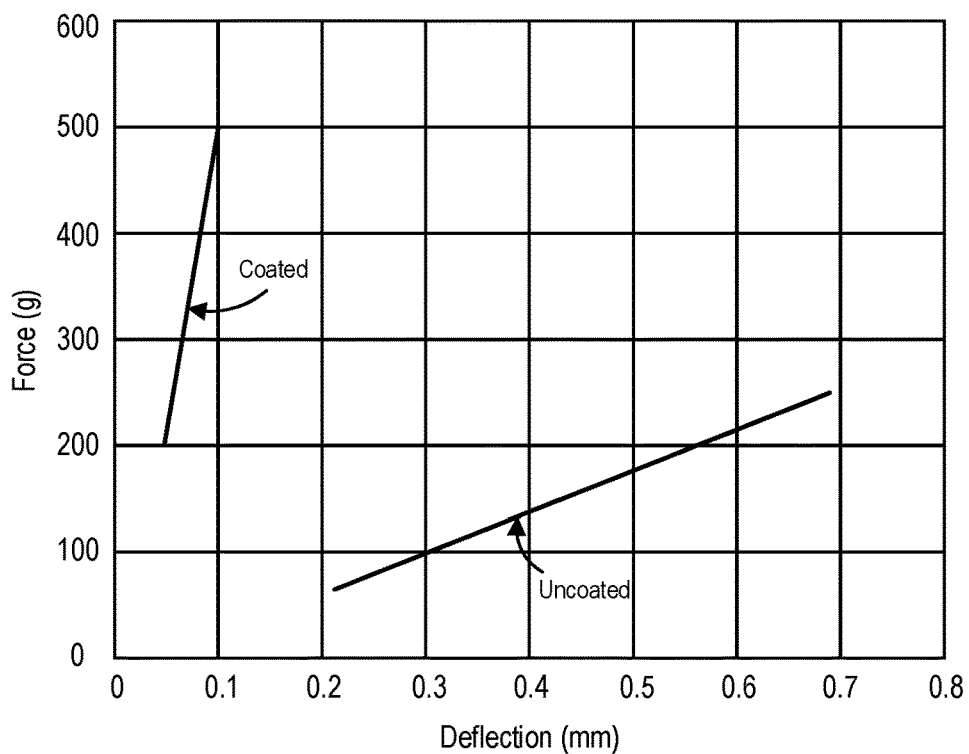
FIG. 4 is a chart illustrating rigidity comparison of a coated and uncoated panel, according to at least one embodiment of the present disclosure.
Figure 5:
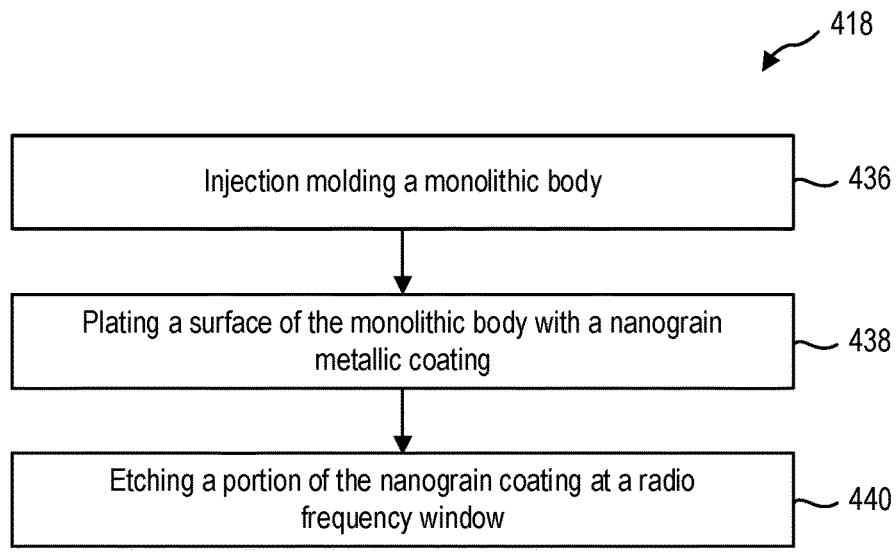
FIG. 5 is a flowchart illustrating another method of manufacturing an electronic device housing, according to at least one embodiment of the present disclosure.

The nano-grain coating increases the strength of the monolithic body by supporting the structure and reducing the deflection of the body panel under force. In some embodiments, a panel of RF transparent material is 5-10 times stronger (e.g., resistant to deflection under force) when coated with between 30 µm and 50 µm of nano-grain coating. A monolithic body panel can, therefore, be molded or shaped from the RF transparent material to a near-finished state and subsequently strengthened through the application of the nano-grain coating. As illustrated in the chart of FIG. 4, in at least one tested example, a monolithic body of ABS with the nano-grain coating exhibits half of the deflection at 4.9 Newtons of force than a monolithic body of ABS without a coating exhibits at less than 1.0 Newtons of force.

In some embodiments, a method 418 of manufacturing an electronic device housing includes injection molding (436) a monolithic body comprising a RF transparent material. A surface of the injection molded monolithic body is then plated (438) with a nanograin metallic coating. In some embodiments, the method further includes etching (440) a portion of the nanograin coating at a RF window with a laser or other energized beam.

Figures 1, 6:
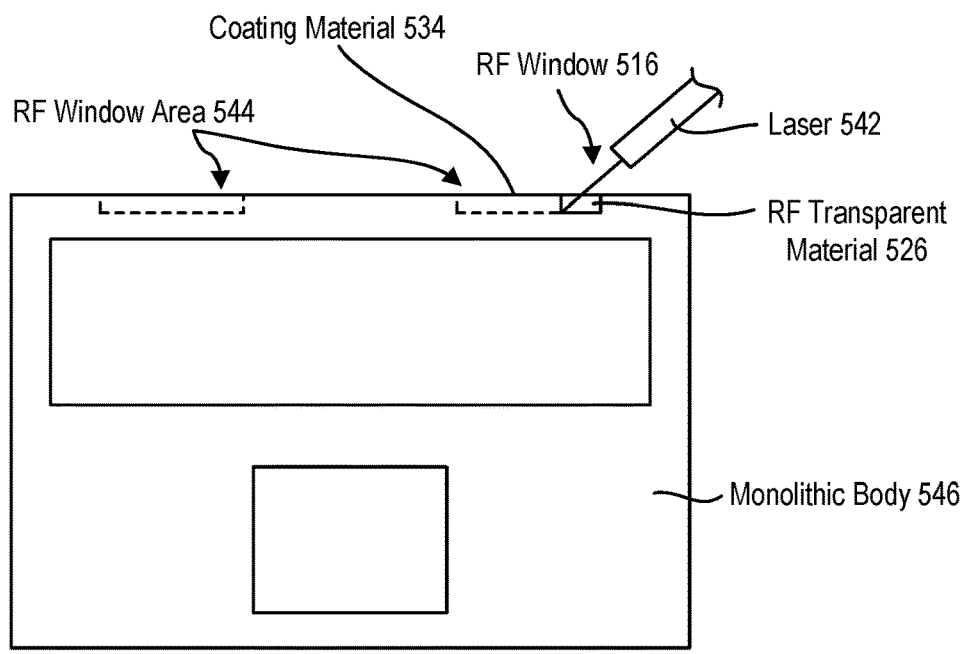
Figures 2, 6:
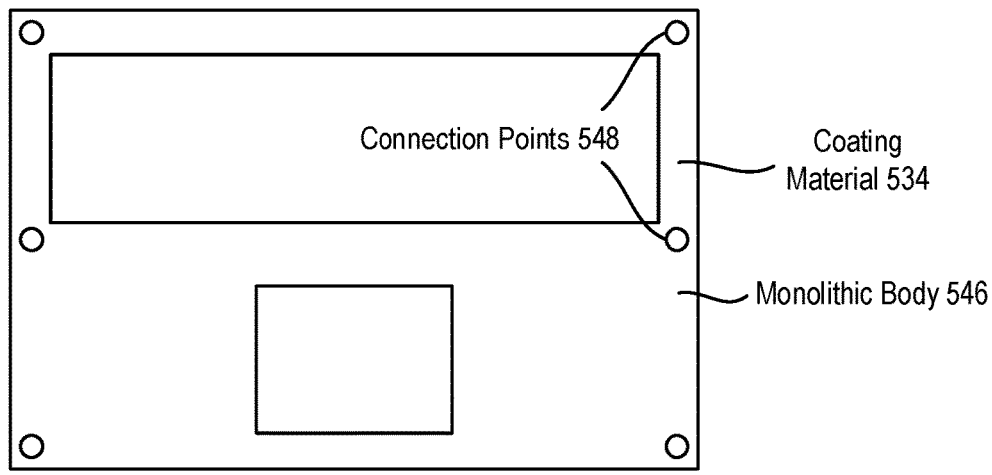
Figures 3, 6:
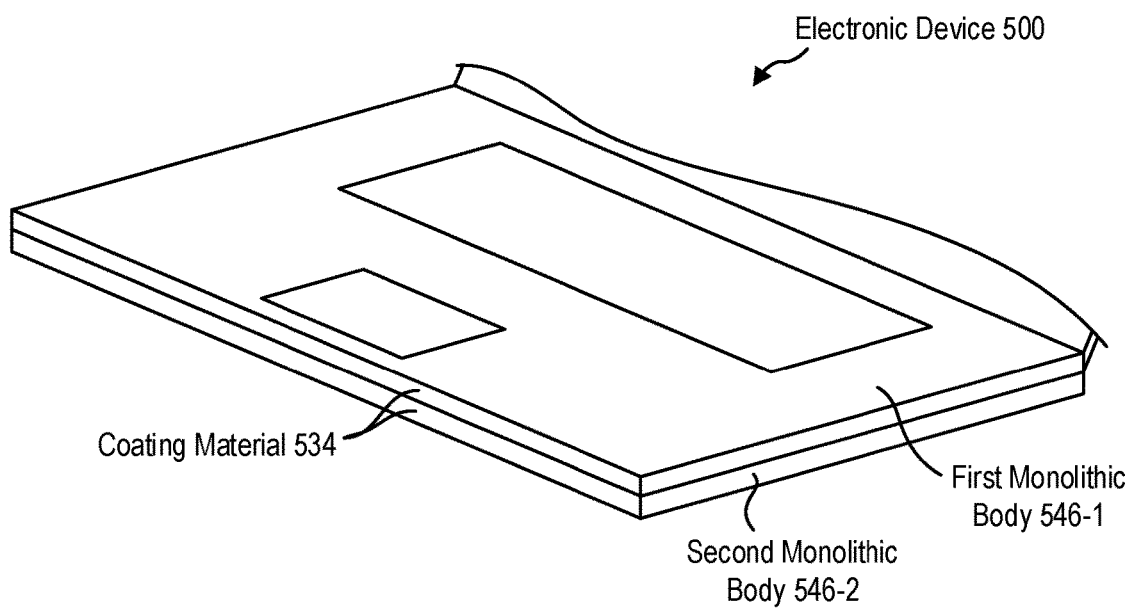

Referring now to FIG. 6-1, in some embodiments, the coating material 534 is etched using a laser 542 to remove the nanograin coating material 534 in the RF window area 544 from the RF transparent material 526 without penetrating through the RF transparent material 526. In this way, the monolithic body 546 remains structurally continuous throughout the RF window 516, providing strength and aesthetic improvements over a conventional aperture through the RF transparent material 526.

In some embodiments, the nanograin coating material 534 is electrically conductive. The electrical conductivity can provide grounding paths for the electronic components in the interior volume of the monolithic body 546. In some examples, the different panels of the electronic device housing may be electrically insulated from one another. As illustrated in FIG. 6-2, in such embodiments, one or more connection points 548 of the monolithic body 546 (e.g., the points at which the monolithic body 546 connects to other body panels and/or to electronic components, such as a motherboard or power supply) has the nanograin coating material 534 removed. In some embodiments, a coating material 534 applied to the posts on an interior surface of the monolithic body 546 is etched or masked to remove the nanograin coating from the posts, electrically insulating the coated monolithic body 546 through the posts. In other embodiments, other connection points 548 of the monolithic body 546 are etched or masked to remove the nanograin coating material 534 and electrically insulated the electronic components attached thereto from the coated monolithic body 546.

In some embodiments, the nanograin coating material 534 can provide electrical conductivity between panels of an electronic device housing. FIG. 6-3 is a perspective view of a base of an electronic device 500. In some embodiments, the electronic device 500 includes at least a first monolithic body 546-1 (e.g., the monolithic body 546 described in relation to FIGS. 6-1 and 6-2) and a second monolithic body 546-2. The coating material 534 is positioned on a surface of the first monolithic body 546-1 and a surface of the second monolithic body 546-2. In some embodiments, the nanograin coating material 534 provides electrical conductivity between the first monolithic body 546-1 and the second monolithic body 546-2, for example, for RF shielding and/or electrical grounding.

In some embodiments, the first monolithic body 546-1 and the second monolithic body 546-2 are plated separately and subsequent contact of the nanograin coating material 534 allows electrical conductivity therebetween. In some embodiments, the first monolithic body 546-1 and the second monolithic body 546-2 are positioned adjacent to and contacting one another before the nanograin coating material 534 is plated on the surface of the first monolithic body 546-1 and the second monolithic body 546-2 to create a continuous surface of nanograin coating material 534, which is electrically conductive throughout.

Figure 7:
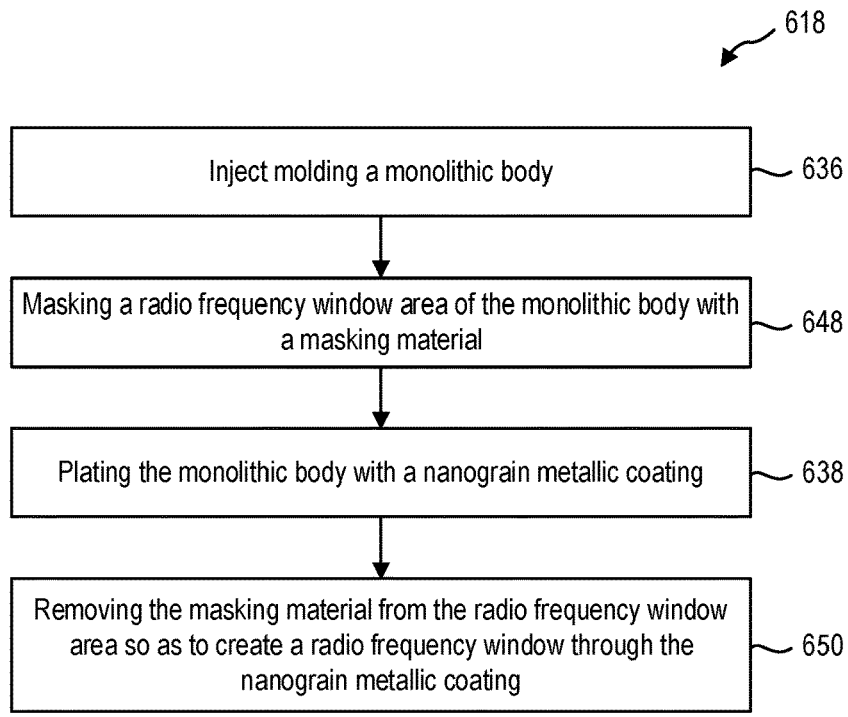
FIG. 7 is a flowchart illustrating yet another method of manufacturing an electronic device housing, according to at least one embodiment of the present disclosure.

Referring now to FIG. 7, in some embodiments, a method 618 of manufacturing an electronic device housing includes injection molding (636) a monolithic body of RF transparent material and masking (648) a RF window are of the monolithic body with a masking material. In some embodiments, the masking material is a masking tape or other solid material. In some embodiments, the masking material is a masking oil or other fluid.

The method further comprises plating (638) the monolithic body with a nanograin metallic coating and at least a portion of the masking material. The method then includes removing (650) the masking material from the RF window area so as to create a RF window through the nanograin metallic coating without penetrating the RF transparent material.

Figure 8:
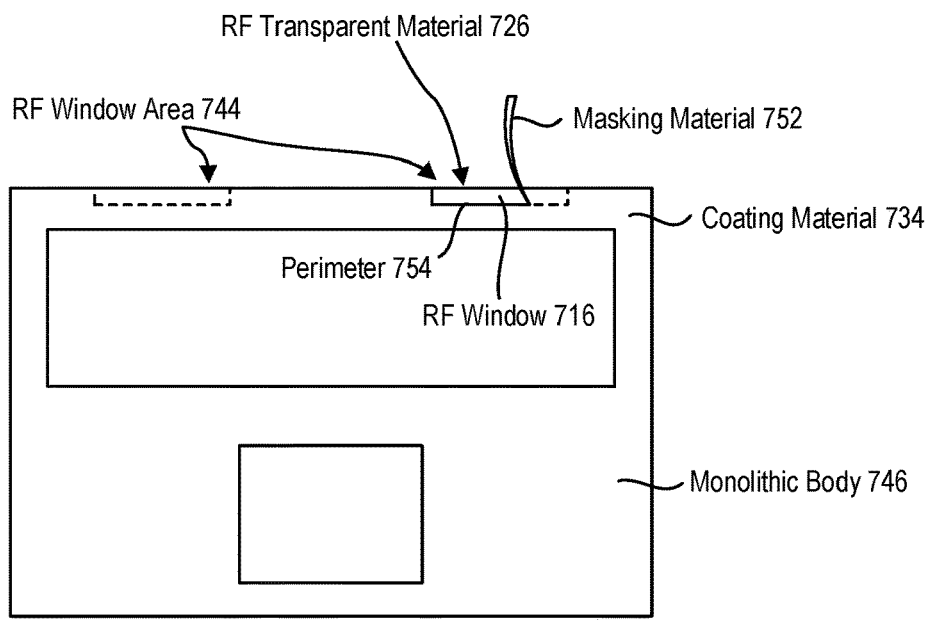
FIG. 8 is a top view of masking off an RF window from a nanograin coating on an electronic device housing, according to at least one embodiment of the present disclosure.

FIG. 8 is a top view of an embodiment of a monolithic body 746 with masked RF window areas 744. The nanograin coating material 734 is applied to the RF transparent material 726 and at least a portion of the masking material 752. When the masking material 752 is lifted from the RF transparent material 726 to create the RF window 716. In some embodiments, the monolithic body 746 has a single RF window 716. In other embodiments, the monolithic body 746 has a plurality of RF windows 716. In some embodiments, a perimeter 754 of the RF window 716 is etched to facilitate the removal of the masking material 752. By etching or ablating through the coating material 734 or through a portion of the thickness of the coating material 734 around the perimeter 754 of the masking material 752, removal of the masking material 752 may have less chance of damaging the coating material 734 adjacent the masking material 752 and outside of the RF window 716.

INDUSTRIAL APPLICABILITY

The present disclosure relates generally to systems and methods for manufacturing an electronic device housing that is stronger and more aesthetically pleasing to a user than a conventional housing. A body panel of a housing according to the present disclosure includes a monolithic body with RF windows that do not have an aperture through the RF transparent material of the monolithic body. By providing an RF window through a coating material, RF signals can pass through the RF transparent material while the body panel remains continuous throughout the RF window and the adjacent areas for strength and appearance.

In some embodiments, a method of manufacturing an electronic device includes obtaining a monolithic body. In some embodiments, the monolithic body is a body panel of an electronic device housing. In some embodiments, the monolithic body is the entire electronic device housing. In some embodiments, the monolithic body is a continuous piece of RF transparent material. The RF transparent material is continuous throughout the monolithic body. In some embodiments, the monolithic body has at least one aperture through the monolithic body from a first surface to an opposing second surface. In some embodiments, the monolithic body is a first body panel of an electronic device housing and has at least one structural post thereon to allow connection to a second body panel of the electronic device housing.

In some embodiments, obtaining the monolithic body includes injection molding the monolithic body. The RF transparent material may be a polymer that is plastic at an elevated temperature and conducive to injection molding. In some embodiments, obtaining the monolithic body includes machining the monolithic body from a billet or other precursor of the RF transparent material. In at least some embodiments, obtaining the monolithic body includes injection molding an RF transparent material to a near-finished state and subsequently machining a portion of the RF transparent material from the near-finished state to produce the monolithic body.

In some embodiments, the RF transparent material is a thermoplastic polymer. In some embodiments, the RF transparent material is acrylonitrile butadiene styrene (ABS). In some embodiments, the ABS is a fiber-loaded ABS.

The method further includes plating a surface of the monolithic body with a conductive coating. In some embodiments, the conductive coating is a nanograin coating in which the average grain size of the coating material is less than 1 micrometer. In some embodiments, the conductive coating is a metallic coating including grain of a metal or metal alloy. In some embodiments, the conductive coating includes cobalt, nickel, or combinations thereof.

In some embodiments, a nanograin coating provides a smoother outer surface with less surface relief and/or texture than a coating with a larger grain size and equivalent thickness. In some embodiments, a nanograin coating provides an outer surface with equivalent surface relief and/or texture to a coating with a larger grain size with a lesser coating thickness. In some embodiments, a nanograin coating exhibits a more random grain orientation in thin coatings than a coating with a larger grain size. A more random grain orientation allows for a more isotropic material property to the coating and the nanograin coating may exhibit less warpage than a coating with a larger grain size.

In some embodiments, a nanograin coating exhibits improved durability and stability relative to a traditional plating of similar or the same materials. In some embodiments, a nanograin coating exhibits improved thermal stability, improved solar radiation stability, lower porosity, improved tensile strength, lower thermal expansion, and other improved bulk material properties relative to a coating with larger grain size.

Nickel coatings can trigger an allergic reaction in some individuals. In some embodiments, a nanograin coating according to the present disclosure includes cobalt. A cobalt nanograin coating maintains the mechanical properties disclosed herein while avoiding nickel allergic reactions in users.

In some embodiments, it is aesthetically and/or functionally desirable to have the monolithic body be continuous through an RF window. For example, the region of the monolithic body that is adjacent to a communication device may be structurally important to the rigidity of the electronic device housing. In other examples, the region of the monolithic body that is adjacent to a communication device may be a visually prevalent portion of the electronic device, such as the bezel of display cover, a surface near an input device, or other area that is conspicuous while using the device and would be distracting to a user to have an obvious gap, seam, or other discontinuity in the electronic device housing.

To allow a communication device to transmit and receive RF signals through the RF window, the coating is removed from the RF window while maintaining the integrity of the monolithic body and the RF transparent material of the monolithic body underneath the coating. In some embodiments, the coating is removed by ablation or mechanical removal of the coating from the monolithic body. For example, the coating may be ablated by a laser, ion beam, or other stream of energize particles. In at least one example, the coating is removed by laser etching the coating from the monolithic body. In some examples, the coating is mechanically removed through friction or erosion of the coating. For example, the coating may be removed by an abrasive wheel or belt such as sandpaper, or the coating may be removed by a flow of abrasive material such as sandblasting.

In some embodiments, a masking material is applied to the RF window region of the monolithic body prior to the application of the coating. After the coating is applied to the surface of the monolithic body and to the masking material, the masking material is removed from the surface of the monolithic body. Removal of the masking material therefore removes the overlaid portion of the coating applied to the masking material. In some embodiments, a combination of removal method is used. In at least one embodiment, the coating at a perimeter edge of the masking material is etched or ablated to produce a precise discontinuity (e.g., a border) around the masking material, and the masking material is subsequently lifted from the surface of the monolithic body. The initial etching or ablation of the coating allows the masking material and coating on the masking material to be removed without unintentionally removing adjacent coating outside of the RF region. In some cases, masking can be done with a metal fixture. The fixture can be plated for conductivity purpose. In some embodiments, the metal mask or masks function as auxiliary electrodes or electrical shield, which reduce or shield electrical field and prevent metallic ion deposition or plating on the RF window region. After plating, the fixture can be removed to leave the RF window region un-plated.

In some embodiments, application of the coating includes shaping the RF transparent material into a near finished shape of the monolithic body. The surface of the monolithic body is then chemically etched to provide surface texture and/or sites into which a first material can be applied. In some embodiments, the first material is a metal. In at least one example, the first metal is cobalt or a cobalt alloy. The first material is applied in an electroless application that allows the first material to bond to the RF transparent material. In some embodiments, the RF transparent material is a polymer that is nonconductive and incompatible with electro-deposition. In some embodiments, the RF transparent material 326 is a polymer that is nonconductive, but the polymer is plateable. For example, ABS has double bonds of polybutadiene that allow for electroplating.

In some embodiments, the method of coating further includes using electro-deposition to deposit a second material on the first material. For example, the second material may be a second metal that is electro-deposited onto the first metal. In some embodiments, the second material has a thickness of approximately 5-10 micrometers ($\mu m$). In some embodiments, the second material has a thickness of more than 10 $\mu m$ or less than 5 $\mu m$. The second material provides a substantially flat and continuous surface upon which the nano-grain coating is subsequently applied.

In some embodiments, the nano-grain coating has a thickness in a range having an upper value, a lower value, or upper and lower values including any of 2 $\mu m$, 5 $\mu m$, 10 $\mu m$, 20 $\mu m$, 30 $\mu m$, 40 $\mu m$, 50 $\mu m$, 60 $\mu m$, 70 $\mu m$, 80 $\mu m$, 90 $\mu m$, 100 $\mu m$, or any values therebetween. In some examples, the nano-grain coating has a thickness greater than 2 $\mu m$. In some examples, the nano-grain coating has a thickness less than 100 $\mu m$. In some examples, the nano-grain coating has a thickness between 2 $\mu m$ and 100 $\mu m$.

In some embodiments, the nanograin coating has an average grain size of less than 50 nanometers (nm). In some embodiments, the nanograin coating has an average grain size of less than 25 nm. In some embodiments, the nanograin coating has an average grain size of less than 15 nm. In some embodiments, the nanograin coating has an average grain size of less than 10 nm. In some embodiments, the nanograin coating has an average grain size of less than 5 nm.

In some embodiments, the nanograin coating is applied by physical vapor deposition (PVD). In some embodiments, the nanograin coating is applied by chemical vapor deposition (CVD). In some embodiments, the nanograin coating is applied by plasma enhanced deposition. In some embodiments, the nanograin coating is applied by electroplating in a fluid.

The nano-grain coating increases the strength of the monolithic body by supporting the structure and reducing the deflection of the body panel under force. In some embodiments, a panel of RF transparent material is 5-10 times stronger (e.g., resistant to deflection under force) when coated with between 30 $\mu m$ and 50 $\mu m$ of nano-grain coating. A monolithic body panel can, therefore, be molded or shaped from the RF transparent material to a near-finished state and subsequently strengthened through the application of the nano-grain coating. In at least one example, a monolithic body of ABS with the nano-grain coating exhibits half of the deflection at 4.9 Newtons of force than a monolithic body of ABS without a coating exhibits at less than 1.0 Newtons of force.

In some embodiments, a method of manufacturing an electronic device housing includes injection molding a monolithic body comprising a RF transparent material. A surface of the injection molded monolithic body is then plated with a nanograin metallic coating. In some embodiments, the method further includes etching a portion of the nanograin coating at a RF window with a laser or other energized beam.

In some embodiments, the coating is etched using a laser to remove the nanograin coating in the RF window from the RF transparent material without penetrating through the RF transparent material. In this way, the monolithic body remains structurally continuous throughout the RF window, providing strength and aesthetic improvements over a conventional aperture through the RF transparent material.

In some embodiments, the nanograin coating is electrically conductive. The electrical conductivity can provide grounding paths for the electronic components in the interior volume of the monolithic body. In some examples, the different panels of the electronic device housing may be electrically insulated from one another. In such embodiments, one or more connection points of the monolithic body (e.g., the points at which the monolithic body connects to other body panels and/or to electronic components, such as a motherboard or power supply) has the nanograin coating removed. In some embodiments, a coating applied to the posts on an interior surface of the monolithic body is etched or masked to remove the nanograin coating from the posts, electrically insulating the coated monolithic body through the posts. In other embodiments, other connection points of the monolithic body are etched or masked to remove the nanograin coating and electrically insulated the electronic components attached thereto from the coated monolithic body.

In some embodiments, the nanograin coating material can provide electrical conductivity between panels of an electronic device housing. In some embodiments, the electronic device includes at least a first monolithic body and a second monolithic body. The coating material is positioned on a surface of the first monolithic body and a surface of the second monolithic body. In some embodiments, the nanograin coating material provides electrical conductivity between the first monolithic body and the second monolithic body, for example, for RF shielding and/or electrical grounding.

In some embodiments, the first monolithic body and the second monolithic body are plated separately and subsequent contact of the nanograin coating material allows electrical conductivity therebetween. In some embodiments, the first monolithic body and the second monolithic body are positioned adjacent to and contacting one another before the nanograin coating material is plated on the surface of the first monolithic body and the second monolithic body to create a continuous surface of nanograin coating material, which is electrically conductive throughout.

In some embodiments, a method of manufacturing an electronic device housing includes injection molding a monolithic body of RF transparent material and masking a RF window are of the monolithic body with a masking material. In some embodiments, the masking material is a masking tape or other solid material. In some embodiments, the masking material is a masking oil or other fluid.

The method further comprises plating the monolithic body with a nanograin metallic coating and at least a portion of the masking material. The method then includes removing the masking material from the RF window area so as to create a RF window through the nanograin metallic coating without penetrating the RF transparent material.

In some embodiments, the monolithic body has a single RF window. In other embodiments, the monolithic body has a plurality of RF windows. In some embodiments, a perimeter of the RF window is etched to facilitate the removal of the masking material. By etching or ablating through the coating or through a portion of the thickness of the coating around the perimeter of the masking material, removal of the masking material may have less chance of damaging the coating adjacent the masking material and outside of the RF window.

The systems and methods according to the present disclosure allow the manufacturing of an electronic device housing that is stronger than a polymer housing without a coating while also providing EM shielding for electronic components and a RF window for antennae of communication devices. The monolithic body is stronger than a body panel with a cutout RF window and is more aesthetically pleasing to a user than having an aperture through the body panel.

The present disclosure relates to systems and methods for manufacturing an electronic device housing according to at least the examples provided in the sections below:

1. A method of manufacturing an electronic device housing, the method comprising:
   obtaining a monolithic body of radio frequency (RF) transparent material (e.g., 326 in FIG. 3);
   plating a surface of the monolithic body with a nanograin coating (e.g., 334in FIG. 3) to increase a structural integrity of the monolithic body; and
   removing a portion of the nanograin coating at a RF window (e.g., 516 in FIG. 6-1).
2. The method of section 1, wherein obtaining the monolithic body includes injection molding the monolithic body.
3. The method of section 1 or 2, wherein the RF transparent material is a thermoplastic polymer.
4. The method of section 1 or 2, wherein the RF transparent material is acrylonitrile butadiene styrene (ABS).
5. The method of section 4, wherein the ABS is fiber-loaded.
6. The method of any of sections 1-5, wherein plating the surface includes etching the RF transparent material before applying a coating material.
7. The method of any of sections 1-6, wherein the nanograin coating includes a metal.
8. The method of any of sections 1-7, wherein the nanograin coating is or includes cobalt.
9. The method of any of sections 1-8, wherein removing the portion of the nanograin coating includes laser etching the nanograin coating.
10. The method of any of sections 1-9, wherein removing the portion of the nanograin coating includes removing a masking material from the surface of the monolithic body.
11. The method of section 10, wherein plating the surface of the monolithic body includes plating the masking material with the nanograin coating.
12. The method of any of sections 1-11, wherein removing the portion of the nanograin coating includes not removing or penetrating through the RF transparent material.
13. An electronic device comprising:
   a monolithic body (e.g., 546 in FIG. 6-1) including an RF transparent material at least partially defining an internal volume of the device;
   a nanograin coating (e.g., 534 in FIG. 6-1) positioned on an outer surface of the monolithic body;
   a communication device (e.g., 114 in FIG. 1) positioned in the internal volume, the communication device configured to wirelessly communicate via RF signals; and
   an RF window (e.g., 516 in FIG. 6-1) of the monolithic body positioned adjacent to the communication device, wherein the RF window is a portion of the monolithic body in which the nanograin coating is not present on the outer surface of the RF transparent material.
14. The electronic device of section 13, wherein the RF transparent material is a polymer.
15. The electronic device of section 13 or 14, wherein the RF transparent material is at least 1 millimeter thick.
16. The electronic device of any of sections 13-15, wherein the nanograin coating is a metallic coating.
17. The electronic device of any of sections 13-16, wherein the monolithic body is a first monolithic body and the nanograin coating provides electrical conductivity to a second monolithic body.
18. The electronic device of any of sections 13-17, wherein a structural rigidity of the monolithic body and the nanograin coating is at least twice that of a structural rigidity of the monolithic body alone.
19. A method of manufacturing an electronic device housing, the method comprising:
   injection molding (e.g., 636, FIG. 7) a monolithic body including a radio frequency (RF) transparent material;
   masking (e.g., 648, FIG. 7) a RF window area of the monolithic body with a masking material;
   plating (e.g., 638, FIG. 7) a surface of the monolithic body and the masking material with a nanograin metallic coating; and
   removing (e.g., 650, FIG. 7) the masking material from the radio frequency window area so as to create a RF window through the nanograin metallic coating.
20. The method of section 19, further comprising:
   masking at least one structural post of the monolithic body with a post masking material;
   plating a surface of the structural post and the post masking material with the nanograin metallic coating; and
   removing the post masking material from the structural post so as to create a nonconductive portion of the structural post.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of manufacturing an electronic device housing, the method comprising:
    obtaining a monolithic body of radio frequency (RF) transparent material;
    plating a surface of the monolithic body with a nanograin coating to increase structural rigidity of the monolithic body, the nanograin coating having an average grain size of less than 1 micrometer; and
    removing a portion of the nanograin coating at a RF window.

2. The method of claim 1, wherein obtaining the monolithic body includes injection molding the monolithic body.

3. The method of claim 1, wherein the RF transparent material is a thermoplastic polymer.

4. The method of claim 1, wherein the RF transparent material is acrylonitrile butadiene styrene (ABS).

5. The method of claim 4, wherein the ABS is fiber-loaded.

6. The method of claim 1, wherein plating the surface includes etching the RF transparent material before applying a coating material.

7. The method of claim 1, wherein the nanograin coating includes a metal.

8. The method of claim 1, wherein the nanograin coating includes cobalt.

9. The method of claim 1, wherein removing the portion of the nanograin coating includes laser etching the nanograin coating.

10. The method of claim 1, wherein removing the portion of the nanograin coating includes removing a masking material from the surface of the monolithic body.

11. The method of claim 10, wherein plating the surface of the monolithic body includes plating the masking material with the nanograin coating.

12. The method of claim 1, wherein removing the portion of the nanograin coating includes not removing or penetrating through the RF transparent material.

13. A method of manufacturing an electronic device housing, the method comprising:
    injection molding a monolithic body including a radio frequency (RF) transparent material;
    masking a RF window area of the monolithic body with a masking material;
    plating a surface of the monolithic body and the masking material with a nanograin metallic coating; and
    removing the masking material from the radio frequency window area so as to create a RF window through the nanograin metallic coating.

14. The method of claim 13, further comprising:
    masking at least one structural post of the monolithic body with a post masking material;
    plating a surface of the structural post and the post masking material with the nanograin metallic coating; and
    removing the post masking material from the structural post so as to create a nonconductive portion of the structural post.

* * * * *